United States Patent
Iida et al.

(10) Patent No.: US 9,778,294 B2
(45) Date of Patent: Oct. 3, 2017

(54) NON-CONTACT AC VOLTAGE MEASUREMENT DEVICE

(71) Applicants: IIDA ELECTRONICS CO., LTD., Ibaraki (JP); NATIONAL INSTITUTE OF TECHNOLOGY, Tokyo (JP)

(72) Inventors: Fujitsugu Iida, Ibaraki (JP); Tomomi Iida, Ibaraki (JP); Shin-ichi Kaito, Ibaraki (JP)

(73) Assignees: IIDA ELECTRONICS CO., LTD., Ibaraki (JP); NATIONAL INSTITUTE OF TECHNOLOGY, Hachioji-shi (JP)

( * ) Notice: Subject to any disclaimer, the term of this patent is extended or adjusted under 35 U.S.C. 154(b) by 0 days.

(21) Appl. No.: 15/501,716

(22) PCT Filed: Aug. 8, 2014

(86) PCT No.: PCT/JP2014/071024
§ 371 (c)(1),
(2) Date: Feb. 3, 2017

(87) PCT Pub. No.: WO2016/021045
PCT Pub. Date: Feb. 11, 2016

(65) Prior Publication Data
US 2017/0227582 A1 Aug. 10, 2017

(51) Int. Cl.
*G01R 31/02* (2006.01)
*G01R 19/175* (2006.01)
(52) U.S. Cl.
CPC .................... *G01R 19/175* (2013.01)
(58) Field of Classification Search
USPC ........................ 324/72, 72.5, 672
See application file for complete search history.

(56) References Cited

U.S. PATENT DOCUMENTS 7,834,645 B2 * 11/2010 Yanagisawa ........... G01R 15/16
324/457
2008/0252336 A1 * 10/2008 Krumme ............... B60R 16/027
327/39

(Continued)

FOREIGN PATENT DOCUMENTS

JP S60-039309 A 3/1985
JP H06-018570 A 1/1994

(Continued)

OTHER PUBLICATIONS

International Search Report issued in PCT/JP2014/071024; dated Oct. 28, 2014.

*Primary Examiner* — Patrick Assouad
*Assistant Examiner* — Demetrius Pretlow
(74) *Attorney, Agent, or Firm* — Studebaker & Brackett PC

(57) ABSTRACT

A non-contact AC voltage measurement device 100 applied to a conductor 12 of an electric wire 16, the device 100 being characterized in that a first electrode 32 is provided outside the electric wire 16, whereby a coupling capacitance 34 is formed between the conductor 12 and the first electrode 32, a parallel circuit 38 having a capacitor 40 and an opening/closing means 50 connected in parallel to the capacitor 40 is provided, the parallel circuit is connected in series to the coupling capacitance, and a first current $I_1$ which flows through the parallel circuit 38 when the opening/closing means 50 of the parallel circuit 38 is closed and a second current $I_2$ which flows through the parallel circuit 38 when the opening/closing means 50 is open are measured for the purpose of measuring the AC voltage 8 applied to the conductor 12.

5 Claims, 6 Drawing Sheets

(56) References Cited

U.S. PATENT DOCUMENTS

| | | | | |
|---|---|---|---|---|
| 2012/0200291 A1* | 8/2012 | Carpenter | ................ | G01R 1/22 |
| | | | | 324/252 |
| 2012/0319675 A1* | 12/2012 | El-Essawy | ............. | G01R 35/02 |
| | | | | 324/74 |
| 2013/0076343 A1* | 3/2013 | Carpenter | .............. | G01R 33/02 |
| | | | | 324/202 |
| 2014/0210460 A1* | 7/2014 | Kuhns | .................... | G01R 21/08 |
| | | | | 324/244 |
| 2014/0354302 A1* | 12/2014 | Lu | ...................... | G01R 19/0084 |
| | | | | 324/658 |

FOREIGN PATENT DOCUMENTS

| | | |
|---|---|---|
| JP | 2001-255342 A | 9/2001 |
| JP | 2001-289885 A | 10/2001 |
| JP | 2003-028900 A | 1/2003 |
| JP | 2006-242855 A | 9/2006 |
| JP | 2007-003407 A | 1/2007 |
| JP | 2007-121215 A | 5/2007 |
| JP | 2013-002911 A | 1/2013 |

\* cited by examiner

NON-CONTACT AC VOLTAGE MEASUREMENT DEVICE

TECHNICAL FIELD

The present invention relates to a measurement technology for measuring, for example, a voltage or the like of AC electric power that is being supplied.

BACKGROUND ART

Heretofore, a measurement device that measures an AC voltage applied to a conductor in an electric wire coated with an insulator has been proposed. This measurement device has been disclosed in, for example, Patent Document 1. The technology relating to the measurement device disclosed in Patent Document 1 is outlined below. Note that the reference numerals used in recitations relating to Patent Document 1 are the reference numerals recited in the embodiments of Patent Document 1 and are different from reference numerals used hereafter in the embodiments of the present application.

At least two capacitors 13 and 14 with different capacitance values are provided. The at least two capacitors 13 and 14 with different capacitance values are selectively connected between a detector probe and a common potential point. A coupling capacitance 12 is formed between the detector probe and a conductor to which a voltage to be measured is being applied. The voltage to be measured is voltage-divided by a voltage division circuit that is structured by the selectively connected capacitor 13 or 14 and the coupling capacitance 12. The connection is switched between the selectively connected capacitors 13 and 14, the coupling capacitance 12 is computed from values of the divided voltages when the two different capacitors are connected and the capacitance values of the two capacitors, and the voltage to be measured is found from the computed coupling capacitance 12.

Patent Document 1: Japanese Unexamined Patent Application, Publication No. 2003-028900

DISCLOSURE OF THE INVENTION

Problems to be Solved by the Invention

To aid understanding, descriptions are given with reference to the example of a publicly known technology disclosed in Patent Document 1. Note that the reference numerals used in the recitations of the Background Art hereabove and corresponding descriptions in this section are the reference numerals recited in the embodiments of Patent Document 1 and are different from the reference numerals used hereafter in the embodiments of the present application. The measurement device disclosed in Patent Document 1 is understood to be solving a problem to be solved that is recited in Patent Document 1. However, there is a further problem to be solved with regard to further improving measurement accuracy. Patent Document 1 recites that the measurement device includes the at least two capacitors 13 and 14 with different capacitance values, that the coupling capacitance 12 is computed by selectively connecting the two capacitors 13 and 14, and that the voltage to be measured is finally found from the coupling capacitance 12 found by the computation.

In the method of switching between the two capacitors 13 and 14 with different capacitance values, computing the coupling capacitance 12 and finding the voltage to be measured from the computed coupling capacitance 12, if there are differences between actual capacitance values of the two capacitors 13 and 14 and nominal values of capacitance used in the computation, then these differences produce measurement errors. Therefore, for the nominal values of capacitance of the two capacitors 13 and 14 to match up with the actual capacitance values, the nominal values of capacitance must be continuously supervised with high accuracy. In practice, this is extremely difficult. As a result, the conventional measurement method has a problem of reduced measurement accuracy. For example, when the two capacitors 13 and 14 used for measurement are incorporated in the measurement device, there are parasitic capacitances between each capacitor and other components, wires and the like in the vicinity of the capacitors. These parasitic capacitances may cause problems including a reduction in accuracy of the nominal values of capacitance of the two capacitors 13 and 14. To prevent a reduction in measurement accuracy, it is important to make the factors lowering measurement accuracy as small as possible.

The above-described method of selectively switching between connections of the two capacitors 13 and 14 presents a difficult problem in regard to maintaining measurement accuracy, which is critically important for a measurement device. In the above description, Patent Document 1 is illustrated as an example and the problem to be solved by the present invention is described with reference to this example.

However, the publicly known technology disclosed in Patent Document 1 is illustrated essentially as no more than an example. Keeping measurement accuracy at a high level is a major issue for the conventional technology disclosed in Patent Document 1 and for other conventional technologies that have been used hitherto. Thus, conventional measurement devices have a problem in that maintaining high measurement accuracy is very difficult.

An object of the present invention is to provide a non-contact AC voltage measurement device that is capable of measurement with higher accuracy.

Means for Solving the Problems

A first invention for solving the problem described above is a non-contact AC voltage measurement device that measures an AC voltage applied to a conductor of an electric wire, the non-contact AC voltage measurement device including: a first electrode provided outside the electric wire, a coupling capacitance being formed between the conductor and the first electrode; and a parallel circuit including a capacitor and an opening/closing means connected in parallel with the capacitor, the parallel circuit being connected in series with the coupling capacitance, wherein, for the purpose of measuring the AC voltage applied to the conductor of the electric wire, a first current and a second current are measured, the first current flowing through the parallel circuit in a state in which the opening/closing means of the parallel circuit is closed, and the second current flowing through the parallel circuit in a state in which the opening/closing means of the parallel circuit is open.

A second invention for solving the problem is a non-contact AC voltage measurement device in which the non-contact AC voltage measurement device according to the first invention further includes: an electric current measurement means that measures the first current and the second current; and a computational processing means that computes the AC voltage applied to the conductor of the electric wire on the basis of the measured first current and second current.

A third invention for solving the problem is a non-contact AC voltage measurement device in which the non-contact AC voltage measurement device according to the first or second invention further includes a shield electrode that covers the first electrode.

A fourth invention for solving the problem is a non-contact AC voltage measurement device in which the non-contact AC voltage measurement device according to one of the first to third inventions further includes a second electrode between the first electrode and the shield electrode, a second coupling capacitance being formed between the second electrode and the first electrode, and the second coupling capacitance performing operations of the capacitor in place of the capacitor.

A fifth invention for solving the problem is a non-contact AC voltage measurement device in which the non-contact AC voltage measurement device according to one of the first to fourth inventions further includes a detection means that detects a state in which the AC voltage applied to the conductor of the electric wire is at a zero-crossing point or close to a zero-crossing state, wherein opening and closing operations of the opening/closing means are controlled on the basis of outputs from the detection means.

A sixth invention for solving the problem is a non-contact AC voltage measurement device in which the non-contact AC voltage measurement device according to one of the first to fifth inventions further includes a monitor device that monitors states of the AC voltage at the conductor.

A seventh invention for solving the problem is a non-contact AC voltage measurement device in which, in the non-contact AC voltage measurement device according to the sixth invention, the monitor device includes a display means, and a waveform of the AC voltage at the conductor is displayed at the display means.

Effects of the Invention

A non-contact AC voltage measurement device according to the present invention provides an effect in enabling measurements with higher accuracy.

PREFERRED MODE FOR CARRYING OUT THE INVENTION

1. Introduction

Figure 1:
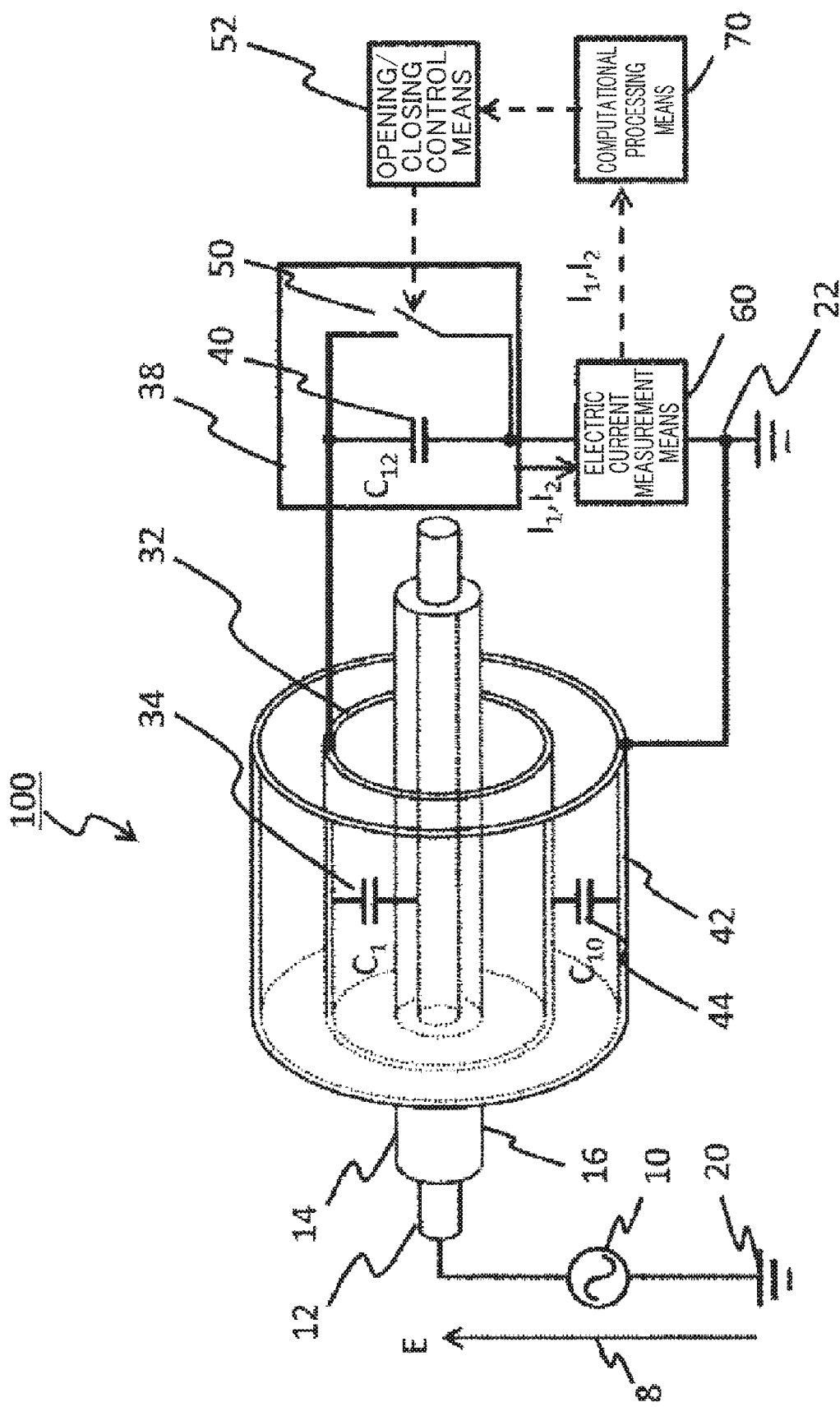
FIG. 1 is a descriptive diagram describing structures of a measurement device in accordance with an embodiment of the present invention.

Now, preferred modes for carrying out the present invention (referred to as embodiments in the present Specification) are described with reference to the attached drawings. Structures in the attached drawings that are substantially the same are assigned the same reference numerals. Structures that are assigned the same reference numerals perform substantially the same operations and provide substantially the same effects. Repetitive descriptions of structures that are assigned the same reference numerals may be omitted.

In the present Specification, the term "measurement" is used with a broad meaning encompassing the meaning of the term "instrumental measurement". The term "computation" and the term "computation processing" are used with broad meanings encompassing various kinds of calculation rather than just algebraic calculations such as arithmetic computations and the like; these terms are used with broad meanings encompassing processing that obtains target values, data and the like on the basis of predetermined conditions, parameters and the like. For example, processing in which target values, data or the like are obtained and stored in advance, by computations, testing or the like based on predetermined conditions, parameters and the like, and then storage contents are searched to find the target values, data or the like falls within the meanings of the terms "computation" and "computation processing" in the present Specification. The term "connection" in the present Specification is used with a broad meaning encompassing not just direct connections but also states of indirect connection, states in which electronic circuits are formed by indirect connections, and so forth.

The embodiments described below solve a range of problems and provide a range of effects. The problems that are solved may include problems that differ from the scope recited in the above section "Problems to be Solved by the Invention" and problems that go beyond this scope. The effects provided by the embodiments described below may include effects that differ from the scope recited in the above section "Effects of the Invention" and effects that go beyond this scope.

2. Description of Basic Structures of an Embodiment Relating to the Present Invention (1) Description of an Example of a Measurement Subject FIG. 1 is a descriptive diagram describing basic structures of a measurement device 100 according to the embodiment of the present invention. The measurement device 100 may in principle be employed in measurements of, for example, voltages from commercial AC power supplies and the like, and moreover of voltages from AC power supplies over a wide frequency range from low frequencies to high frequencies, and so forth. Furthermore, the present invention may be applied to measurements of a wide range of voltages from, for example, from low voltages of no more than a few volts to high voltages exceeding hundreds of kilovolts. Thus, measurement subjects of the present invention are not limited to particular subjects. The basic structures of the present invention are described below with reference to an example in which the invention is applied to measurements of voltage of, as an example, an AC power supply for supplying electricity.

A transmission system of the AC power supply may be any of various systems such as, for example, a single-phase two-wire system, a three-phase three-wire system or the like. The circuit structure depicted in FIG. 1 represents the basic structure of a measurement circuit that is applicable to various systems. An electric wire 16 that supplies AC electric power is provided with an insulating coating 14 and a conductor 12 that is covered by the insulating coating 14. A voltage to be measured 8, which is an AC voltage that is a measurement subject, is applied to the conductor 12 of the electric wire from a power supply 10. The voltage to be measured 8 is represented as E (measured in volts). The AC voltage E (V) that is the voltage to be measured 8 is applied from the power supply 10, between a reference potential point 20 and the conductor 12, and supplied through the electric wire 16. The measurement device 100, which is an embodiment in which the present invention is employed, may measure the AC voltage E (V) supplied by the electric wire 16 at arbitrary positions.

(2) Description of Structures of the Measurement Device 100

The measurement device 100 described below is capable of measuring the AC voltage E (V) applied to the conductor 12 in the state in which the conductor 12 is covered by the insulating coating 14, which is to say a non-contact state. To avoid complexity and aid understanding of the principles of operation of the embodiment depicted in FIG. 1, the conductor 12 is shown as a simple circular tube shape and the insulating coating 14 covering the conductor 12 is also shown as a simple circular tube shape. However, these shapes are merely an example. The shapes of the conductor 12 to which the voltage to be measured 8 is applied and the insulating coating 14 covering the outer periphery of the conductor 12 are not limited to circular tube shapes. For example, the conductor 12 may be a twisted wire and, apart from a circular tube shape, the insulating coating 14 may be in a polygonal shape, an elliptical shape or the like.

Now, structures of the measurement device 100 are described. The measurement device 100 includes an electrode 32 that is provided to oppose the insulating coating 14. As a result, a coupling capacitance 34 is formed between the conductor 12 and the electrode 32. The measurement device 100 further includes a reference potential point that has a constant relationship with the reference potential point 20, for example, a reference potential point 22 with the same potential as the reference potential point 20. For example, the reference potential point 20 and the reference potential point 22 may be in a mutual grounded state. The measurement device 100 also includes a capacitor 40 and an opening/closing means 50. The capacitor 40 is connected in series with the coupling capacitance 34 between the conductor 12 and the reference potential point 22. The opening/closing means 50 is connected in parallel with the capacitor 40. The capacitor 40 and the opening/closing means 50 form a parallel circuit 38. The measurement device 100 also includes an electric current measurement means 60, a computational processing means 70 and an opening/closing control means 52. The electric current measurement means 60 measures currents flowing through the parallel circuit 38. The computational processing means 70 computes the voltage to be measured 8 from measurement results from the electric current measurement means 60. The opening/closing control means 52 controls opening and closing of the opening/closing means 50 in accordance with commands from the computational processing means 70. The broken lines in FIG. 1 represents flows of information and flows of control commands.

The measurement device 100 measures a current $I_1$ and a current $I_2$ with the electric current measurement means 60. The current $I_1$ flows from the conductor 12 through the coupling capacitance 34 and the parallel circuit 38 to the reference potential point 22 in a state in which the opening/closing means 50 is closed. The current $I_2$ flows from the conductor 12 through the coupling capacitance 34 and the parallel circuit 38 to the reference potential point 22 in a state in which the opening/closing means 50 is open. The computational processing means 70 computes the voltage to be measured 8 from the measured current $I_1$ and current $I_2$. A description of computation processing according to the present structure is given below. The system of measurement of the voltage to be measured 8 according to the present structure provides the effects recited below.

(3) Description of Effects Provided by the Present Structure

Because the coupling capacitance 34 formed by the provision of the electrode 32 and the parallel circuit 38 including the capacitor 40 and the opening/closing means 50 are provided, a voltage at the conductor 12 may be measured in a state of non-contact with the conductor 12. Because a direct connection with the conductor 12 is not necessary, the voltage to be measured 8 may be measured at a required position of the electric wire 16 with the state in which the electric wire 16 is covered with the insulating coating 14 at this position being altered. The voltage to be measured 8 may be measured regardless of the shape of the conductor 12 and regardless of the material and the like of the insulating coating 14.

In contrast to a system of switching connection between two capacitors, the voltage to be measured 8 may be measured using the parallel circuit 38 with the single capacitor 40 and the opening/closing means 50. Therefore, it is easier to improve measurement accuracy. The voltage of the conductor 12 relative to the reference potential point 20 is found using values of current flowing through the parallel circuit 38 in the state in which the opening/closing means 50 is closed and the state in which the opening/closing means 50 is open. Therefore, a high measurement accuracy may be maintained by a capacitance value $C_{12}$ of the single capacitor 40 being maintained with high accuracy.

In a system of switching between two capacitors, nominal values of capacitance of the two capacitors must be maintained with high accuracy. When there is a single capacitor, it is comparatively easy to supervise the nominal value of capacitance of the capacitor with high accuracy, by measuring the actual capacitance value of the capacitor and suchlike. In contrast, supervising the nominal values of capacitance of two or more capacitors is very difficult.

In the present invention, the opening/closing means 50 is provided, the terminals of the capacitor 40 are switched between open circuit and short circuit, currents are measured in these states, and the voltage value E of the voltage to be measured 8 is calculated. In the state in which the terminals of the capacitor 40 are short-circuited by the opening/closing means 50, large changes in electrical characteristics of the parallel circuit 38 due to the effects of environmental conditions, particularly temperature, are unlikely to occur. That is, in the state in which the opening/closing means 50 is closed, large changes in electrical characteristics of the parallel circuit 38 and a consequent reduction in measurement accuracy or the like are unlikely to occur. Thus, there is a significant effect in that measurement accuracy may be more easily improved than in a system of switching between two capacitors.

The fact that, as described above, factors causing large changes in electrical characteristics of the parallel circuit 38 are very slight when the terminals of the capacitor 40 are short-circuited is extremely advantageous for productivity when manufacturing products employing the present invention, compared to the related art. Moreover, products employing the present invention are easy to maintain, and ease of use in measurement operations is excellent.

(4) Specific Structures of Structures Constituting the Basic Circuit, and Descriptions of Improvements, Modifications and the Like

[Description of the Electrode 32]

The electrode 32 is provided for the purpose of forming the coupling capacitance 34 with the conductor 12. Therefore, disposing the electrode 32 to oppose the conductor 12 is desirable, or bringing the electrode 32 to the conductor 12 and disposing the electrode 32 close to the conductor 12 is desirable. The structure of the electrode 32 shown in FIG. 1 forms a shape that covers the whole of the outer periphery of the electric wire 16. When the electrode 32 is formed thus, there are effects in that a large surface area opposing the conductor 12 may be assured and the capacitance value of the coupling capacitance 34 may be made large. However, a shape that extends over the whole circumference of the outer periphery of the electric wire 16 is not a necessary condition of the present invention. With a view to maintaining high measurement accuracy, it is desirable if the area of the electrode 32 opposing the conductor 12 is large and the capacitance value of the coupling capacitance 34 is greater than a predetermined value. Provided it is possible for the electrode 32 to have a predetermined area opposing the conductor 12, the coupling capacitance 34 can be formed with a capacitance value required for measurement. How much of the outer periphery of the electric wire 16 must be covered to provide a predetermined area of the electrode 32 opposing the conductor 12 will vary from case to case. However, a shape of the electrode 32 that extends over the whole circumference or substantially the whole circumference of the outer periphery of the electric wire 16 has an excellent advantage in forming the coupling capacitance 34 with a larger capacitance value.

With regard to making the capacitance value of the coupling capacitance 34 large, it is desirable if the electrode 32 is adjacent to the outer periphery of the insulating coating 14. It is also desirable to maintain a constant positional relationship between the electric wire 16 and the electrode 32 during measurement operations. Therefore, a structure in which the electrode 32 is fixed in contact with the outer periphery of the electric wire 16 is desirable. An insulator with elasticity may be provided at the inner side of the electrode 32 and the insulator with elasticity may touch against the outer periphery of the electric wire 16 so as to fix the positional relationship between the electrode 32 and the electric wire 16. For example, a structure may be formed in which a shield electrode 42, which is described below, and the electrode 32 can both be divided. The divided structures are both put together in a shape sandwiching the electric wire 16, the coupling capacitance 34 is formed between the electrode 32 and the conductor 12 as depicted in FIG. 1, and a coupling capacitance 44 is formed between the shield electrode 42 and the electrode 32, as described below. In this case, disposing an insulator with elasticity between the electrode 32 and the outer periphery of the electric wire 16 such that the positional relationships between the electric wire 16 and the electrode 32 and the shield electrode 42 are fixed by the sandwiching of the electric wire 16 is desirable.

The electrode 32 and the shield electrode 42 are shown as circular tube shapes in FIG. 1 and other drawings in order to avoid complexity in the drawings, but these are not necessarily preferred shapes. Although it is desirable if shapes of the electrode 32 and the shield electrode 42 in a cross section orthogonal to the direction along the conductor 12 are circles or shapes close to circles, for example, polygonal shapes are also possible. Further, elliptical shapes and other shapes are also possible.

However, because the shape of the insulating coating 14 covering the conductor 12 is generally close to a circular tube shape, in order to dispose the electrode 32 that is disposed to oppose the conductor 12 as close to the conductor 12 as possible, it is preferable if the shape of the electrode 32 in the cross section orthogonal to the conductor 12 is a circle or a shape close to a circle. It is also preferable if the shape of the shield electrode 42 covering the electrode 32 in the cross section orthogonal to the conductor 12 is a circle or a shape close to a circle. The above descriptions similarly apply to an electrode 36 depicted in FIG. 3, described hereafter.

[Description of the Capacitor 40]

How the capacitor 40 should be formed and what structure the capacitor 40 should be formed in are not necessary conditions of the present invention. The capacitor 40 of the present invention is not limited in terms of type or shape of capacitor. However, supervising the capacitance value of the capacitor 40 with high accuracy is desirable for the measurement device 100 to maintain high measurement accuracy. The capacitance value of the capacitor 40 may be periodically measured with another instrument for updating the nominal value of the capacitance of the capacitor 40. The measurement device 100 may include a function that measures the capacitance value of the capacitor 40 with high accuracy. A capacitor of a type that is appropriate and desirable for usage conditions of the measurement device 100, with a preferable capacitance value and a preferable shape, may be used as the capacitor 40.

[Description of the Opening/Closing Means 50]

The opening/closing means 50 may be an opening/closing means that mechanically opens and closes the circuit such as, for example, a relay, and the opening/closing means 50 may be an opening/closing means structured by a semiconductor switch. The opening/closing control means 52 operates in response to commands from the computational processing means 70 controlling measurement operations. The opening/closing means 50 described above operates in accordance with operations of the opening/closing control means 52. The opening/closing control means 52 operates as a driving circuit for the opening/closing means 50 described above that is an opening/closing means such as a relay or an opening/closing means constituted of a semiconductor.

For example, if the opening/closing means 50 is an opening/closing means such as a relay, a current for activating the relay is supplied to the opening/closing means 50 from the opening/closing control means 52. Alternatively, if the opening/closing means 50 is a semiconductor switch, a driving current for activating the semiconductor switch is supplied from the opening/closing control means 52.

[Description of the Electric Current Measurement Means 60]

The electric current measurement means 60 measures the current $I_1$ flowing through the parallel circuit 38 in the state in which the opening/closing means 50 is closed and the current $I_2$ flowing through the parallel circuit 38 in the state in which the opening/closing means 50 is open. The electric current measurement means 60 may directly measure currents flowing through the parallel circuit 38 for the current values. The electric current measurement means 60 may also measure a condition that changes in correspondence with the currents $I_1$ and $I_2$ such as, for example, a voltage.

For example, if the electric current measurement means 60 employs a capacitor as an electric current measurement element, a voltage across the capacitor is a voltage division of the voltage to be measured 8. If the voltage across the capacitor in the state in which the opening/closing means 50 of the parallel circuit 38 is closed is represented by $V_1$ and the voltage across the capacitor in the state in which the opening/closing means 50 of the parallel circuit 38 is open is represented by $V_2$, the voltage value of the voltage to be measured 8 may be found from the voltages $V_1$ and $V_2$ in a similar manner to a technique using the currents $I_1$ and $I_2$ that is described below.

In the following descriptions, with a view to aiding understanding, the operational principles of the present invention are described through a method that uses the currents $I_1$ and $I_2$. It will be clear that the operational principles of the present invention may be described through various techniques. The operational principles of the present invention may also be described by reference to the voltages $V_1$ and $V_2$ mentioned above. However, to avoid duplication of descriptions, only a description using the currents $I_1$ and $I_2$ is given.

The currents $I_1$ and $I_2$ flowing through the capacitor have a constant relationship with the voltages $V_1$ and $V_2$, which is to say a functional relationship. Therefore, the voltages $V_1$ and $V_2$ may be understood as representing the currents $I_1$ and $I_2$. The method using the currents $I_1$ and $I_2$ that is recited below may also be described for a situation in which the voltages $V_1$ and $V_2$ are measured.

For the above reasons, a means that outputs voltages as measurement results can be recited as the electric current measurement means 60 in the present Specification, provided the voltages that are outputted have a functional relationship with currents flowing through the parallel circuit 38. In the present Specification, the meanings of the terms "current $I_1$" and "current $I_2$" include voltages with a functional relationship with the currents $I_1$ and $I_2$ such as, for example, the voltages $V_1$ and $V_2$.

If, as described above, the electric current measurement means 60 measures currents, a circuit component with a known impedance value may be disposed in a circuit through which the currents being measured flow, and voltages produced across this circuit component may be measured to be used as values of the currents being measured. This circuit component may be a resistance, or may be a coil, a capacitor or the like. The smaller the value of an impedance that is used for measuring the currents $I_1$ and $I_2$, the smaller any effects of the impedance on the series circuit of the coupling capacitance 34 and parallel circuit 38. Therefore, using an impedance with a small value is desirable.

In the embodiment that is described below using FIG. 4, a voltage detection means 62 is provided for measuring zero-crossing points of an AC voltage. Outputs of the voltage detection means 62 are not simply periodic changes in accordance with the AC voltage waveform; the outputs of the voltage detection means 62 change in accordance with current values flowing through the parallel circuit 38. Therefore, the currents $I_1$ and $I_2$ may be measured using outputs of the voltage detection means 62 instead of the electric current measurement means 60. Both the voltage detection means 62 and the electric current measurement means 60 may be provided to obtain both information on zero-crossing points, based on outputs from the voltage detection means 62, and information on currents flowing through the parallel circuit 38. Providing both the voltage detection means 62 and the electric current measurement means 60 may reduce effects on the series circuit of the coupling capacitance 34 and parallel circuit 38. There are further advantages in simplification of the circuits and suchlike.

[Description of the Computational Processing Means 70]

The computational processing means 70 is equipped with, for example, a function for overall control of measurement operations of the measurement device 100, a function for calculating the voltage to be measured 8 through computations based on the currents $I_1$ and $I_2$ mentioned above, and functions for inputting data to the measurement device 100 and outputting computation results, other processing results, and various states of the measurement device 100 such as errors and the like. The computational processing means 70 may be equipped with an input/output unit, a communications unit and a storage unit. For example, the computational processing means 70 may be an electronic computer inside which a central processing unit in the form of a CPU is provided, such as a personal computer.

When a measurement operation by the computational processing means 70 is started by an operator, the computational processing means 70 controls the opening/closing control means 52 in accordance with a pre-specified measurement procedure, controlling the opening/closing means 50 into the open state and the closed state, and reading measurement results for currents flowing through the parallel circuit 38 from the electric current measurement means 60 to be used as the current $I_1$ and the current $I_2$. In accordance with the pre-specified measurement procedure, the computational processing means 70 then calculates the voltage to be measured 8 on the basis of the acquired currents $I_1$ and $I_2$. The calculated voltage to be measured 8 may be displayed at the input/output unit of the computational processing means 70, which is not described here, and may be transmitted to a pre-specified external apparatus, external system or the like by a communications function of the computational processing means 70.

3. Description of Measures Against Noise from Outside (1) Explanation of the Importance of Anti-Noise Measures As a result of investigations by the inventors of the present invention, it became clear that measurement operations by the structure described above may suffer significant impairment from the effects of external electrical noise on the measurement operations. When the present invention is employed, the voltage to be measured 8 may be measured with high accuracy even in the state of non-contact with the conductor 12 of the electric wire 16. Because measurements are possible in a state of non-contact with the conductor 12, voltages of the conductor 12 may be measured at arbitrary positions of the electric wire 16. However, there may be many sources producing electrical noise in the vicinity of a location where the electric wire 16 is actually provided. In order to enable high accuracy measurements of voltage at the conductor 12 at arbitrary positions of the electric wire 16, it is important to avoid the effects of electrical noise as much as possible.

(2) Description of the Embodiment in Relation to Anti-Noise Measures

In FIG. 1, the shield electrode 42 is provided so as to cover the electrode 32, and the shield electrode 42 is electrically connected to the reference potential point 22. The effects of external noise on the electrode 32 and the coupling capacitance 34 may be greatly moderated by this structure. Because the shield electrode 42 is provided, the coupling capacitance 44 is formed between the shield electrode 42 and the electrode 32. However, even though the coupling capacitance 44 is formed, the voltage to be measured 8 may be calculated with high accuracy on the basis of the currents $I_1$ and $I_2$ measured by the electric current measurement means 60. This is explained below.

An ordinary electrical conductor may be used as the material of the shield electrode 42. The shape of the shield electrode 42 is not particularly limited. To prevent the entry of external noise as much as possible, the shield electrode 42 covers as much as possible of the electrode 32; a structure in which the shield electrode 42 covers the whole of the electrode 32 is desirable. In FIG. 1, the length of the electrode 32 in the direction along the electric wire 16 is substantially the same as the length of the shield electrode 42, but this is merely an example. The effects of external noise on the electrode 32 and the coupling capacitance 34 may be further moderated by making the length of the shield electrode 42 in the direction along the electric wire 16 longer than the length of the electrode 32 in the direction along the electric wire 16.

4. Description of an Equalizer Circuit of the Structure Depicted in FIG. 1

Figure 2:
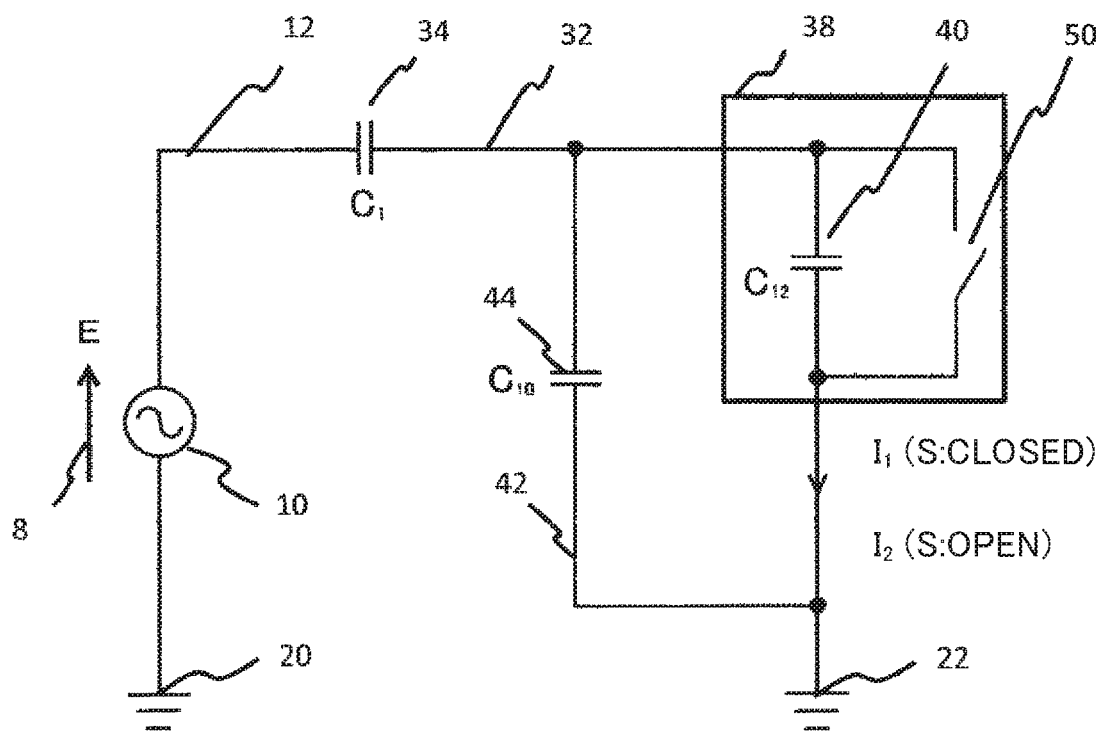
FIG. 2 is a descriptive diagram describing an equalizer circuit of the measurement device depicted in FIG. 1.

FIG. 2 is a descriptive diagram describing an equalizer circuit of the measurement device 100 depicted in FIG. 1. The voltage to be measured 8 from the power supply 10 is applied between the reference potential point 20 and the conductor 12. The coupling capacitance 34 formed by the provision of the electrode 32 and the parallel circuit 38 including the opening/closing means 50 and the capacitor 40 are connected in series between the conductor 12 and the reference potential point 22. The coupling capacitance 44 formed by the provision of the shield electrode 42 is connected between the electrode 32 and the reference potential point 22. The coupling capacitance 44 is connected in parallel with the parallel circuit 38.

As described above, the current flowing through the parallel circuit 38 in the state in which the opening/closing means 50 is closed is the current $I_1$, and the current flowing through the parallel circuit 38 in the state in which the opening/closing means 50 is open is the current $I_2$. In the state in which the opening/closing means 50 is closed, the current $I_1$ according to the voltage to be measured 8 that is applied to the conductor 12 flows through the coupling capacitance 34 and the opening/closing means 50 of the parallel circuit 38. In contrast, in the state in which the opening/closing means 50 is open, the current $I_2$ according to the voltage to be measured 8 that is applied to the conductor 12 flows through the coupling capacitance 34 and the capacitor 40 of the parallel circuit 38. The currents $I_1$ and $I_2$ or the like as described above are measured by the electric current measurement means 60, and the voltage value E of the voltage to be measured 8 is computed on the basis of the measurement results.

Herein, E represents the voltage value of the voltage to be measured 8, $C_1$ represents the capacitance value of the coupling capacitance 34, $C_{12}$ represents the capacitance value of the capacitor 40, and $C_{10}$ represents the capacitance value of the coupling capacitance 44. The voltage value E of the voltage to be measured 8 can be found from the following formula (1) using the two currents $I_1$ and $I_2$ measured by the electric current measurement means 60 and two constants $\alpha$ and $\beta$, which depend on the capacitance value $C_{12}$ of the capacitor 40 and the capacitance value $C_{10}$ of the coupling capacitance 44.

[Formula 1]

$$E = \beta I_1 / (I_1/I_2 - \alpha) \quad (1)$$

The two constants $\alpha$ and $\beta$ may be found in advance by, for example, applying a known voltage to at least two wires, in which the diameters or the like of the conductors 12 of the electric wires 16 are different and the capacitance values $C_1$ of coupling capacitances formed between the conductors 12 and the electrode 32 are different, and measuring the two current values described above. Details of how $\alpha$ and $\beta$ are found are described below.

The current $I_1$ and the current $I_2$ may be found by a common circuit calculation method based on the equalizer circuit. A ratio of the current $I_1$ to the current $I_2$ that is found by the common circuit calculation method based on the equalizer circuit, and the computation result, are shown in formula (2).

[Formula 2]

$$\frac{I_1}{I_2} = \frac{C_{12} + C_{10}}{C_{12}} + \frac{C_1}{C_{12}} \quad (2)$$

Assuming that the capacitance value $C_{10}$ of the coupling capacitance 44 and the capacitance value $C_{12}$ of the capacitor 40 are constants, the constant $\alpha$ is defined as given in formula (3).

[Formula 3]

$$\alpha = \frac{C_{12} + C_{10}}{C_{12}} \quad (3)$$

Using the value of $\alpha$ given by formula (2), $C_1$ can be expressed as in the following formula.

[Formula 4]

$$C_1 = \left(\frac{I_1}{I_2} - \alpha\right) C_{12} \quad (4)$$

Therefore, if an angular frequency of the power supply 10 is represented by omega, the voltage value E of the voltage to be measured 8 that is to be found is given by formula (5), from which formula (1) can be derived.

[Formula 5]

$$E = \frac{I_1}{\omega C_1} = \frac{1}{\omega C_{12}} \frac{1}{\frac{I_1}{I_2} - \alpha} I_1 = \frac{\beta}{\frac{I_1}{I_2} - \alpha} I_1 \quad (5)$$

Formula (6) gives the value of $\beta$. Under consistent conditions, the angular frequency omega is a constant.

[Formula 6]

$$\beta = \frac{1}{\omega C_{12}} \quad (6)$$

If the current values obtained from the electric current measurement means 60 have been converted to voltage values and outputted, or amplified and outputted, the value of $\beta$ is a constant multiple of the value in formula (6). However, the basic technique is the same.

The constants $\alpha$ and $\beta$ may be found in advance, for example, as follows from currents $I_1$, $I_2$, $I'_1$ and $I'_2$. These are the currents measured when the opening/closing means 50 is closed and when the opening/closing means 50 is open, when equal voltages of value $E_0$ are applied to at least two wires in which the diameters or the like of the conductors 12 of the electric wires 16 are different and the capacitance values $C_1$ of coupling capacitances formed between the conductors 12 and the electrode 32 are different.

Using the computation formula (1) and representing the current values with $I_1$, $I_2$, $I'_1$ and $I'_2$, $E_0$ is given by formula (7)

[Formula 7]

$$E_0 = \frac{\beta}{\frac{I_1}{I_2} - \alpha} I_1 = \frac{\beta}{\frac{I'_1}{I'_2} - \alpha} I'_1 \quad (7)$$

To find $\alpha$, formula (7) is rearranged to formula (8). Thus, $\alpha$ can be found from $I_1$, $I_2$, $I'_1$ and $I'_2$ using formula (8).

[Formula 8]

$$\alpha = \frac{I_2 - I'_2}{I_1 - I'_1} \cdot \frac{I_1}{I_2} \cdot \frac{I'_1}{I'_2} \quad (8)$$

The value of $\beta$ can be found from $I_1$, $I_2$ and $E_0$ using formula (9).

[Formula 9]

$$\beta = \frac{E_0}{I_1}\left(\frac{I_1}{I_2} - \alpha\right) \quad (9)$$

The currents measured by the electric current measurement means 60 vary depending on the sizes of the electrode 32 and the shield electrode 42, the thickness of the electric wire 16, the voltage value E and frequency of the voltage to be measured 8, and so forth. However, for example, if the capacitance value $C_1$ is 1 pF, the amplitude E of the voltage to be measured 8 is 100 V, and the frequency is 50 Hz, then the value of $I_1$ is 31.4 nA. If the AC currents are in the region of tens of nA, measurements can be made by a method such as, for example, converting currents to voltages using an impedance of a size that can be disregarded and amplifying the voltages using an operational amplifier or the like.

5. Description of Study Results Based on Tests (1) Description of Testing

Below, Table 1 is an example of measurement results obtained by testing the measurement device 100 shown in FIG. 1. In these measurements, the voltage to be measured E is a sinusoidal AC voltage of 100 V with a frequency of 60 Hz. Table 1 shows measured values of current obtained for KIV wires, in which the cross-sectional areas of the conductors are 0.75 mm², 2 mm² and 5.5 mm², and calculated values obtained by applying computation formula (1). In this case, the constants $\alpha$ and $\beta$ found in advance were $\alpha=1.671$ and $\beta=0.4360$ GΩ.

TABLE 1

| Type of electric wire | Current $I_1$ when the opening/closing means 50 is closed | Current $I_2$ when the opening/closing means 50 is open | Calculated value E[V] |
|---|---|---|---|
| KIV 0.75 mm² | 35.34 | 19.86 | 99.8 |
| KIV 2.0 mm² | 42.77 | 23.03 | 100.2 |
| KIV 5.5 mm² | 72.86 | 36.64 | 100.0 |

From Table 1, it can be seen that in the structure in which only the single capacitor 40 is provided and the shield electrode 42 is provided as a measure against external noise, voltage measurements can be suitably implemented in a state of non-contact with the conductor 12 of the electric wire 16, regardless of the diameter of the conductor 12.

(2) Description of Study Results Based on the Tests

The results of this study based on tests showed that the following issue is very important for measurement accuracy. The nominal value of capacitance of the capacitor 40 used in the device was 5 pF, but the capacitance value $C_{12}$ of the capacitor 40 found using formula (6) was 6.084 pF, which is different from the nominal value. This shows that voltage measurements with high accuracy could be achieved regardless of differences between the nominal value of capacitance of the capacitor 40 and the capacitance value $C_{12}$ of the capacitor 40. That is, in spite of a difference between the nominal value and the actual value of capacitance of the capacitor 40, the effects of a reduction in measurement accuracy due to this difference are seen to be small in the measurement device employing the present invention.

(3) Description of Effects Provided by an Embodiment in which the Present Invention is Employed According to an embodiment in which the present invention is employed, there is an effect in that, even if there is a difference from the nominal value in the capacitance value of the capacitor, effects on measurement errors due to this difference are small. This is a very important effect. Even if the actual capacitance value $C_{12}$ of the capacitor 40 changes a little from the nominal value of capacitance of the capacitor 40 due to the effects of parasitic capacitances and the like when the capacitor 40 is incorporated in equipment, for example, in a process of manufacture of the equipment, the change of the capacitance value $C_{12}$ in an instrument in which the present invention is employed has little effect in causing a reduction in measurement accuracy. This is an excellent effect.

According to the embodiment in which the present invention is employed, the constants required for formula (1) can be found in advance by applying a known voltage to two or more electric wires, in which the diameters or the like of the conductors 12 of the electric wires 16 are different and the capacitance values $C_1$ of the coupling capacitances 34 formed between the conductors and the electrode 32 are different, and measuring the two current values for each wire. Then, during measurement, the voltage value E of the voltage to be measured 8 can be found through simple computational processing using formula (1) when the two currents $I_1$ and $I_2$ have been measured.

According to the embodiment in which the present invention is employed, even if environmental conditions such as temperature and the like change and the capacitance value of the coupling capacitance 34 varies, simple correction is possible by, for example, applying a known voltage to the two or more wires in which the diameters of the conductors 12 of the electric wires 16 are different or the like and the capacitance values $C_1$ of the coupling capacitances 34 formed between the conductors 12 and the electrode 32 are different and measuring the two current values for each wire.

According to the embodiment in which the present invention is employed, because the shield electrode 42 is provided so as to cover the electrode 32, the voltage to be measured may be measured with high accuracy even if a noise source is nearby.

Figure 3:
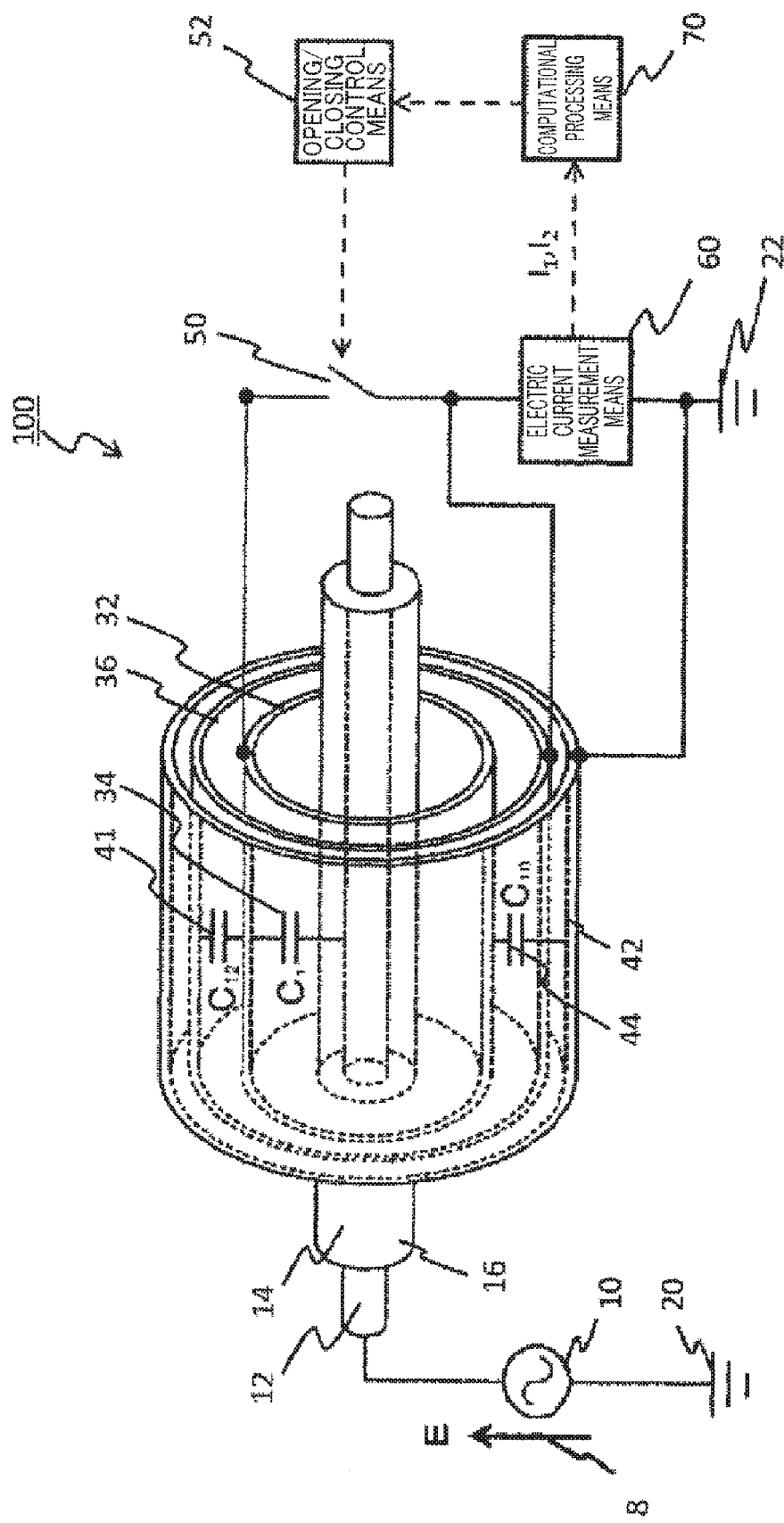
FIG. 3 is a descriptive diagram describing an alternative embodiment of a measurement device 100 employing the present invention.

6. Description of an Alternative Embodiment in which the Present Invention is Employed FIG. 3 is a descriptive diagram showing the structure of an alternative embodiment of the measurement device 100 employing the present invention. In the measurement device 100 according to the present embodiment, a new electrode 36 is provided, as a result of which a coupling capacitance 41 is formed between the electrode 32 and the electrode 36. The coupling capacitance 41 operates in a similar manner to the capacitor 40 depicted in FIG. 1. Structures in FIG. 3 with the same reference numerals as in FIG. 1 operate in substantially the same manner. The parallel circuit 38 in FIG. 1 is formed of the capacitor 40 and the opening/closing means 50. In FIG. 3, the parallel circuit 38 is not shown in order to avoid complexity in the illustration. However, the opening/closing means 50 and the coupling capacitance 41 are connected in parallel to form the parallel circuit 38 in the same manner as above.

In the measurement device 100 depicted in FIG. 3, basic operations to measure the voltage to be measured 8 that is applied between the conductor 12 and the reference potential point 20 are the same as in the descriptions given using FIG. 1 and FIG. 2. Duplicative descriptions of the principles and operations of measurement are not given here. The measurement device 100 depicted in FIG. 3 is similar to the measurement device 100 described using FIG. 1 and FIG. 2 in the problems that are solved and the effects, Duplicative descriptions of which are not given here. The coupling capacitance 41 provides operations similar to the capacitor 40 as described above, and provides similar effects with the capacitor 40. Although a capacitance value $C_{12}$ of the capacitor 40 and a capacitance value of the coupling capacitance 41 differ fundamentally, the capacitor 40 and the coupling capacitance 41 operate in the same manner and descriptions are given with the capacitance value of the coupling capacitance 41 being represented by the same symbol $C_{12}$.

In the embodiment depicted in FIG. 3, similarly to the preceding embodiment, in the state in which the opening/closing means 50 is closed, the current $I_1$ flows from the conductor 12 to the reference potential point 22 through the coupling capacitance 34 formed by the provision of the electrode 32 and through the opening/closing means 50 structuring the parallel circuit 38, which is not shown in FIG. 3. The current $I_1$ is measured by the electric current measurement means 60. In the state in which the opening/closing means 50 is open, the current $I_2$ flows from the conductor 12 to the reference potential point 22 through the coupling capacitance 34 and the coupling capacitance 41 structuring the unillustrated parallel circuit 38, and the current $I_2$ is measured by the electric current measurement means 60. Similarly to the embodiment described above, the voltage value E of the voltage to be measured 8 may be found from the currents $I_1$ and $I_2$ measured by the electric current measurement means 60 using formula (1).

In the present embodiment, even though the capacitance value $C_{12}$ of the coupling capacitance 41 formed between the electrode 36 and the electrode 32 is unknown, the two constants α and β to be used when calculating the potential value E of the voltage to be measured 8 may be found in advance without measuring the capacitance value $C_{12}$ of the coupling capacitance, by, for example, applying a known voltage to two or more electric wires, in which the diameters or the like of the conductors 12 of the electric wires 16 are different and the capacitance values $C_1$ of the coupling capacitances 34 formed between the conductors 12 and the electrode 32 are different, and measuring the two currents $I_1$ and $I_2$. The present embodiment has an advantage in that, because the capacitance value $C_{12}$ of the coupling capacitance 41 is the coupling capacitance between the electrode 32 and the electrode 36, the capacitance value $C_{12}$ of the coupling capacitance 41 has greater flexibility, compared to using an actual capacitor as in the preceding embodiment.

According to the present embodiment, even when the capacitance value $C_{12}$ of the coupling capacitance formed between the electrode 36 and the electrode 32 is unknown and the capacitance value $C_{10}$ of the coupling capacitance between the electrode 32 and the shield electrode 42 is unknown, the voltage value E of the voltage to be measured 8 may be found by simple computation processing using formula (1) from the two currents $I_1$ and $I_2$ and the constants α and β. Because the electrode 36 and the coupling capacitance 41 produced by the electrode 36 are covered by the shield electrode 42, even if there is a noise source in the vicinity, the effects of external noise may be moderated and high accuracy measurements may be made. In the present embodiment, because there is little effect of external noise on either the coupling capacitance 34 or the coupling capacitance 41, the voltage of the electric wire 16 may be measured with high accuracy in a location in which measurements are expected to be needed, regardless of the presence of noise sources. Other structures of the measurement device 100 such as, for example, the opening/closing means 50, the electric current measurement means 60, the computational processing means 70 and the opening/closing control means 52 may be disposed within the apparatus of the measurement device 100. Therefore, the effects of external noise may be moderated by methods that are commonly used, such as covering the equipment with a metal case. The same also applies to the preceding embodiment. In the preceding embodiment depicted in FIG. 1, the capacitor 40 may be disposed inside the equipment of the measurement device 100. Therefore, the effects of external noise on the capacitor 40 may be moderated by methods that are commonly used, and it is not necessary to cover the capacitor 40 with the shield electrode 42.

In the present embodiment, similarly to the preceding embodiment, even if environmental conditions such as temperature and the like change and the capacitance values of the coupling capacitance 34 and the coupling capacitance 41 change, simple correction is possible by, for example, as described above, applying a known voltage to two or more wires in which the diameters or the like of the conductors 12 of the electric wires 16 are different and the capacitance values $C_1$ of the coupling capacitances 34 formed between the conductors 12 and the electrode 32 are different and measuring the two current values $I_1$ and $I_2$.

7. Description of Another Alternative Embodiment in which the Present Invention is Employed (1) Description of Measures Against the New Problem of Transient States Caused by Opening and Closing Operations of the Opening/Closing Means 50

Figure 4:
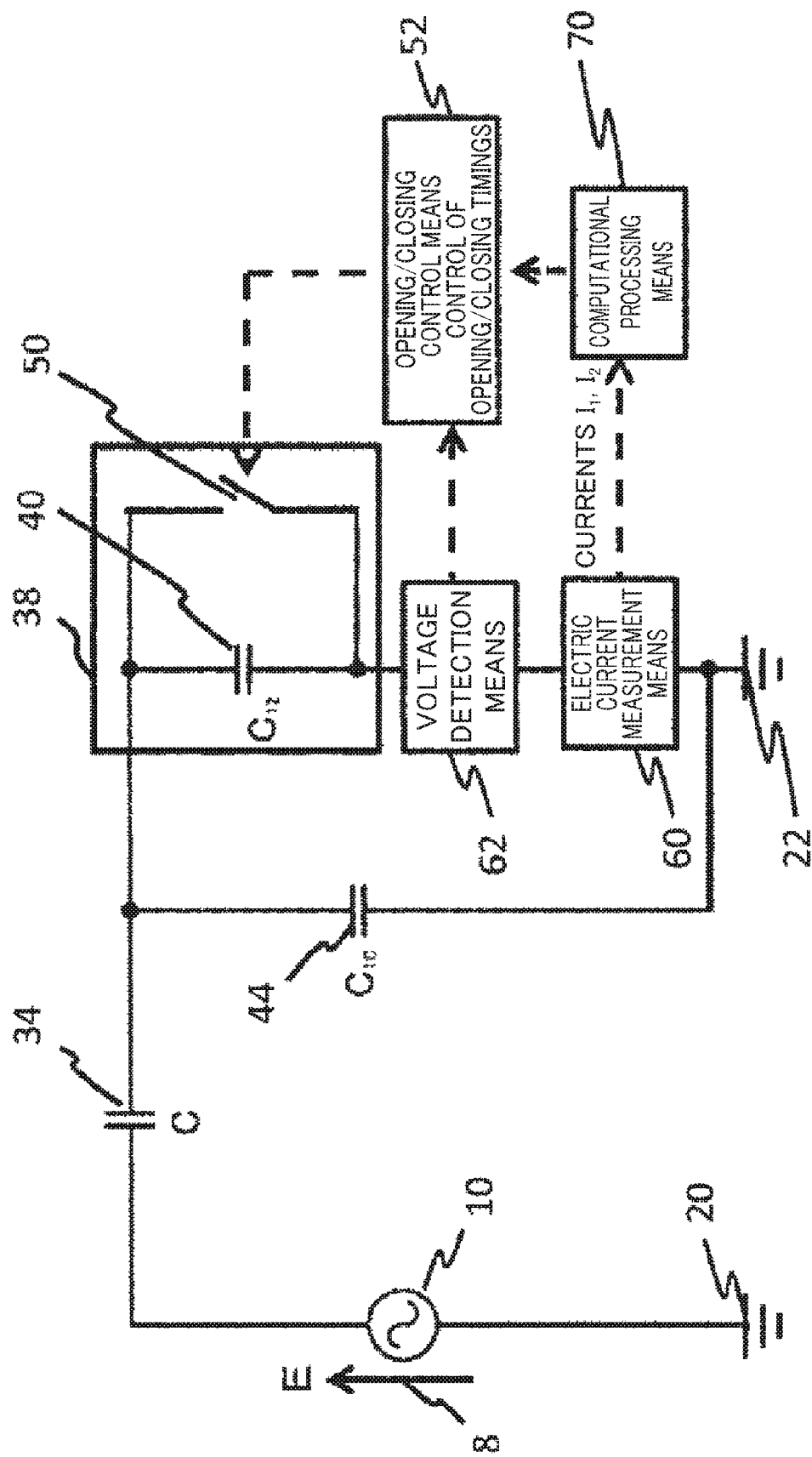
FIG. 4 is a descriptive diagram describing another alternative embodiment employing the present invention.

FIG. 4 is a descriptive diagram describing another alternative embodiment employing the present invention. An improvement in the embodiment depicted in FIG. 4 is to suppress as far as possible transient states associated with opening and closing operations of the opening/closing means 50. The method in which the connection between the terminals of the capacitor 40 is opened and closed by the opening/closing means 50 provides a range of effects as described above. However, for example, if the opening/closing means 50 is closed in a state in which there is a large voltage between the terminals of the capacitor 40, a short-circuit current flows through the opening/closing means 50. When large transient current flows, it takes time to, for example, return to a steady state. In addition, noise may be produced by the transient current and may have effects on other equipment and the like.

The voltage detection means 62 is provided. The opening/closing control means 52 performs control to open and close the opening/closing means 50 in states in which the voltage between the terminals of the capacitor 40 is less than a predetermined voltage. For example, if an AC voltage supplied from the power supply 10 to the electric wire 16 is an alternating current with a constant frequency, in states in which the AC voltage of the electric wire 16 at a measurement position is close to 0 V, the voltage between the terminals of the capacitor 40 is close to 0 V. Therefore, if the voltage detection means 62 is provided with a function that detects states in which the AC voltage in the electric wire 16 is close to 0 V or that detects timings of states in which the voltage between the terminals of the capacitor 40 is close to 0 V, opening and closing of the opening/closing means 50 may be controlled in accordance with detection results from the voltage detection means 62. The voltage detection means 62 operates as a means for outputting signals representing states in which the voltage is close to 0 V as described above or timings of states in which the voltage is close to 0 V, that is, signals representing zero-crossing points or points close to zero-crossing points.

The location at which the voltage detection means 62 depicted in FIG. 4 is connected is illustrated merely as an example. Where the voltage detection means 62 is connected and what kind of input information is used are not particularly important. What is important is that the voltage detection means 62 outputs information representing timings of states in which the terminal voltage of the capacitor 40 or the voltage value E of the voltage to be measured 8 is 0 V or is close thereto at less than a predetermined voltage. The opening/closing control means 52 opens and closes the opening/closing means 50 on the basis of outputs from the voltage detection means 62, which are information representing timings of states in which the terminal voltage of the capacitor 40 or the voltage value E of the voltage to be measured 8 is 0 V or is close thereto at less than a predetermined voltage.

When the opening/closing means 50 closes, if the terminal voltage of the capacitor 40 is in a state close to 0 V, no large current flows as a transient current in association with the closing operation of the opening/closing means 50. Thus, a steady state is attained in a short duration. Correspondingly, when there is an opening operation of the opening/closing means 50, if the voltage applied to the capacitor 40 is a small voltage close to 0 V, a transient voltage caused by the opening operation of the opening/closing means 50 is small and a steady state is attained in a short duration. A measurement operation may not be conducted by the electric current measurement means 60 before a transient state has settled. Therefore, to make rapid progress in measurement operations, it is desirable to rapidly proceed from transient states to steady states.

It is sufficient if the voltage detection means 62 is capable of detecting timings of states in which the voltage of the voltage to be measured 8 is at or close to the zero-crossing point as described above. It is likely that there are a range of detection systems and detection circuits available. However, detection may be conducted by, for example, connecting up a capacitor, with a large capacitance value so as to have little effect on current detection by the electric current measurement means 60, and forming a structure to divide the voltage to be measured. In this case, because the voltage across the capacitor that is connected to structure the voltage detection means 62 corresponds with the voltage to be measured 8, timings at which the voltage across the capacitor is at or close to 0 V may be detected. Opening and closing of the opening/closing means 50 is controlled by the opening/closing control means 52 at the timings that are the detection results of the voltage detection means 62. Thus, the opening/closing means 50 can be opened and closed in the conditions described above, and transient states can proceed to steady states in short durations.

The voltage across the capacitor provided for the purpose of operation of the voltage detection means 62 varies with the current flowing across the capacitor as a parameter. Therefore, this capacitor may be used both for the detection of timings by the voltage detection means 62 and as a current measurement means of the electric current measurement means 60. Accordingly, the number of electronic components structuring the measurement device 100 may be reduced, improving productivity and making maintenance easier.

In FIG. 4, outputs of the voltage detection means 62 are sent to the opening/closing control means 52, the opening/closing control means 52 receives commands to perform opening operations and closing operations from the computational processing means 70, and the opening/closing control means 52 controls the opening/closing means 50 in accordance with the commands from the computational processing means 70 at timings on the basis of the outputs from the voltage detection means 62. However, this is merely an example. Is also possible for the outputs of the voltage detection means 62 to be sent to the computational processing means 70 and for the computational processing means 70 to send opening and closing command signals to the opening/closing control means 52 at timings based on the outputs of the voltage detection means 62. In this case, the opening/closing control means 52 drives the opening/closing means 50 and controls opening and closing operations of the opening/closing means 50 on the basis of the opening and closing commands from the computational processing means 70 and on the basis of timings from the computational processing means 70.

(2) Description of Study Results Based on Tests

Tests of detection of zero-crossing states of the voltage to be measured 8 described using FIG. 4 and of control of the opening/closing means 50, which was structured by a semiconductor switch, were conducted in practice and the results were evaluated. After the semiconductor switch provided to serve as the opening/closing means 50 was switched from the open state to the closed state and after switching from the closed state to the open state, at zero-crossing states of the voltage to be measured 8, transient currents caused by the energy of charges accumulated at the capacitor and the like were measured. It was verified that steady states were achieved in durations shorter than 10 ms.

Accordingly, for example, with a commercial power supply with a frequency of 50 Hz, when a semiconductor switch structuring the opening/closing means 50 is in the open state or in the closed state, the current $I_1$ or the current $I_2$ flowing to the reference potential point 22 through the coupling capacitance 34 and the parallel circuit 38 is measured at 20 ms intervals, which are single cycles of 50 Hz. Including this duration with a duration for a transient state to proceed to a steady state in accordance with switching between the open and closed states of the semiconductor switch structuring the opening/closing means 50 (referred to as dead time) and suchlike, it is possible to output a measurement result of the voltage to be measured 8 in a minimum duration of 60 ms. If, for example, the voltage varies over a duration longer than 60 ms, which is three cycles of the AC voltage, the voltage to be measured may be measured to track this variation. That is, if the commercial AC power supply varies in voltage over a longer duration than several cycles of the frequency thereof, voltage variations can be measured to track this variation.

Because the opening and closing operations of the opening/closing means 50 are performed at timings at or close to zero-crossing points of the voltage to be measured 8, which is to say the voltage variations applied to the parallel circuit 38, synchronously with periodic changes in the voltage to be measured 8, the transient states associated with opening and closing operations of the opening/closing means 50 may quickly return to steady states. Thus, the time required for measurement may be shortened. Moreover, noise produced by transient states in association with opening and closing operations of the opening/closing means 50 may be suppressed and adverse effects on other equipment and the like may be prevented.

Figure 5:
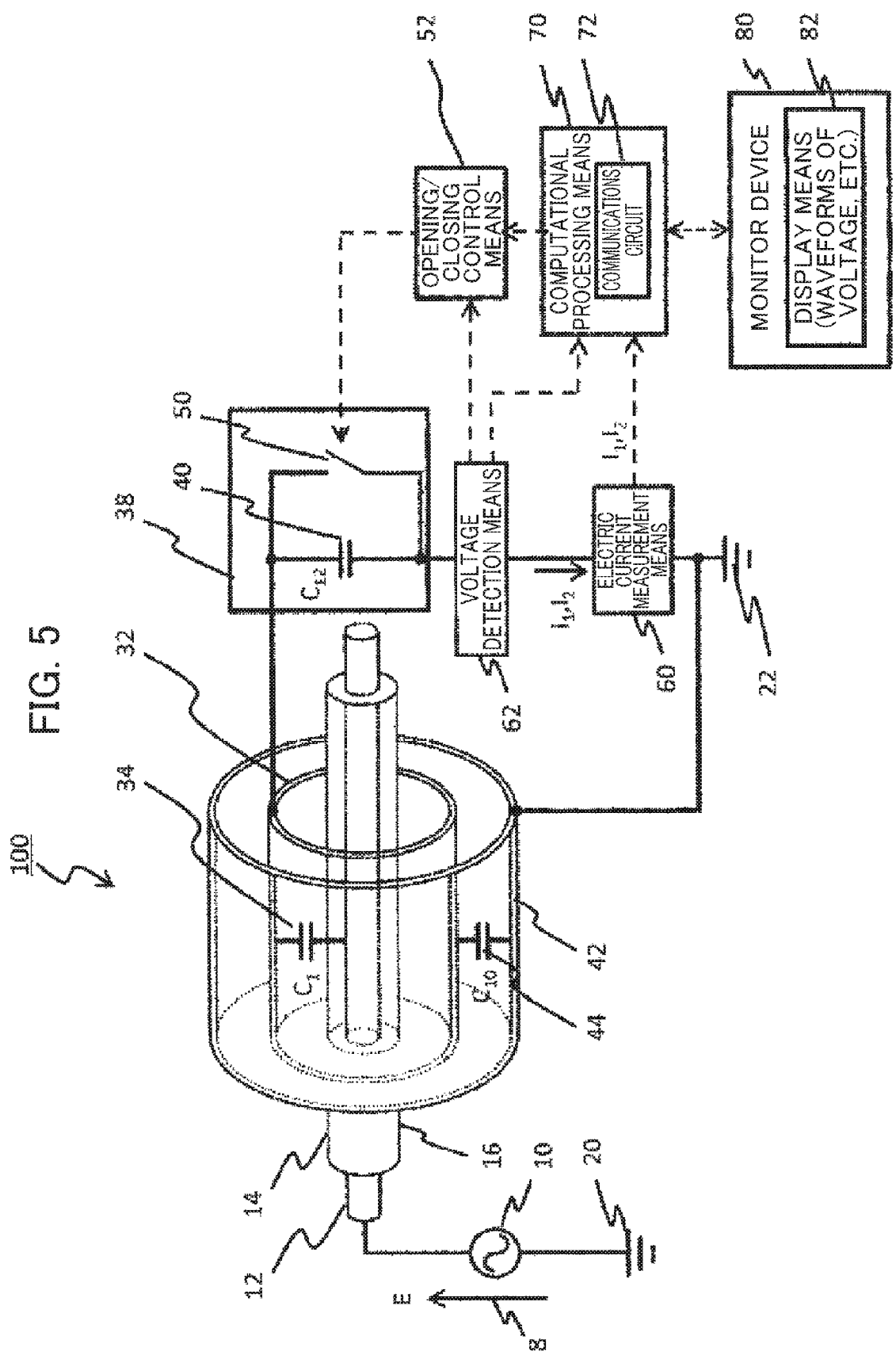
FIG. 5 is a descriptive diagram describing still another alternative embodiment employing the present invention.

8. Description of Still Another Alternative Embodiment in which the Present Invention is Employed FIG. 5 is a descriptive diagram describing still another alternative embodiment of the measurement device 100 employing the present invention. Structures with the same reference numerals as in the preceding embodiments perform the same operations and provide the same effects. Repetitive descriptions of structures with the same reference numerals are not given. The currents $I_1$ and $I_2$ measured by the electric current measurement means 60 are read into the computational processing means 70, and the voltage value E of the voltage to be measured 8 is computed by the computational processing means 70. In the present embodiment, a monitor device 80 is provided that is equipped with a display means 82 such as an LCD or the like. The monitor device 80 monitors voltage waveforms, current waveforms and the like, and may display the same at the display means 82. Clearly, computation results computed by the computational processing means 70 may be displayed at the display means 82 as waveforms or as numerical values.

A waveform of the current $I_1$ or the current $I_2$ may be displayed by sampling the current $I_1$ or current $I_2$ outputted by the electric current measurement means 60 at intervals of a predetermined duration, reading the samples into the monitor device 80 and displaying the same at the display means 82. Thus, because the waveform of the current $I_1$ or the current $I_2$ depends on the voltage to be measured 8 that is applied to the conductor 12 of the electric wire 16, states of the voltage waveform of the voltage to be measured 8 may be monitored. Of course, computation results of the computational processing means 70 may be displayed at the display means 82 in graph form. Alternatively, outputs of the voltage detection means 62 described above may be read in and displayed at the display means 82. When a waveform described above or the like is read into the monitor device 80, for example, conditions of the waveform may be inspected and, if there is some abnormality, the monitor device 80 may perform an operation to report the abnormality.

Exchanges of information between the computational processing means 70 and the monitor device 80 may be implemented by employing a wired circuit using a wiring board, and may be implemented by employing wired or wireless communications using a communications circuit 72. Further, exchanges of information may employ a dedicated line, and may employ a wired LAN, a wireless LAN or the like.

9. Description of a Usage Example of the Measurement Device 100 Employing the Present Invention How the measurement device 100 employing the present invention is to be used is not particularly limited. One usage example of the measurement device 100 is described using FIG. 6. The present embodiment is an example of measurement of a voltage $E_{AB}$ between two electric wires 16A and 16B. In this example, two measurement devices 100A and 100B are used. Each of the measurement devices 100A and 100B corresponds with the measurement device 100 described above, being equipped with the structures and providing the effects described in relation to the measurement device 100.

Structures of the measurement device 100 A are illustrated with the letter "A" appended to the reference numerals of the structures of the measurement device 100; these correspond with one another. Accordingly, the structures of the measurement device 100 A are not described here. Similarly, structures of the measurement device 100 B are illustrated with the letter "B" appended to the reference numerals of the structures of the measurement device 100; these correspond with one another. Accordingly, the structures of the measurement device 100 B are not described here.

According to the method described above, a voltage $V_A$ between a reference potential point 20A and a conductor 12A may be measured in a non-contact state by the measurement device 100 A, and a voltage $V_B$ between a reference potential point 20B and a conductor 12B may be measured in a non-contact state by the measurement device 100 B. The voltage $E_{AB}$ between the two electric wires 16A and 16B may be calculated by computation from the measured voltages $V_A$ and $V_B$. Because the measurement device 100 A and the measurement device 100 B have respective shield electrodes 42A and 42B, the effects of external noise may be moderated.

Figure 6:
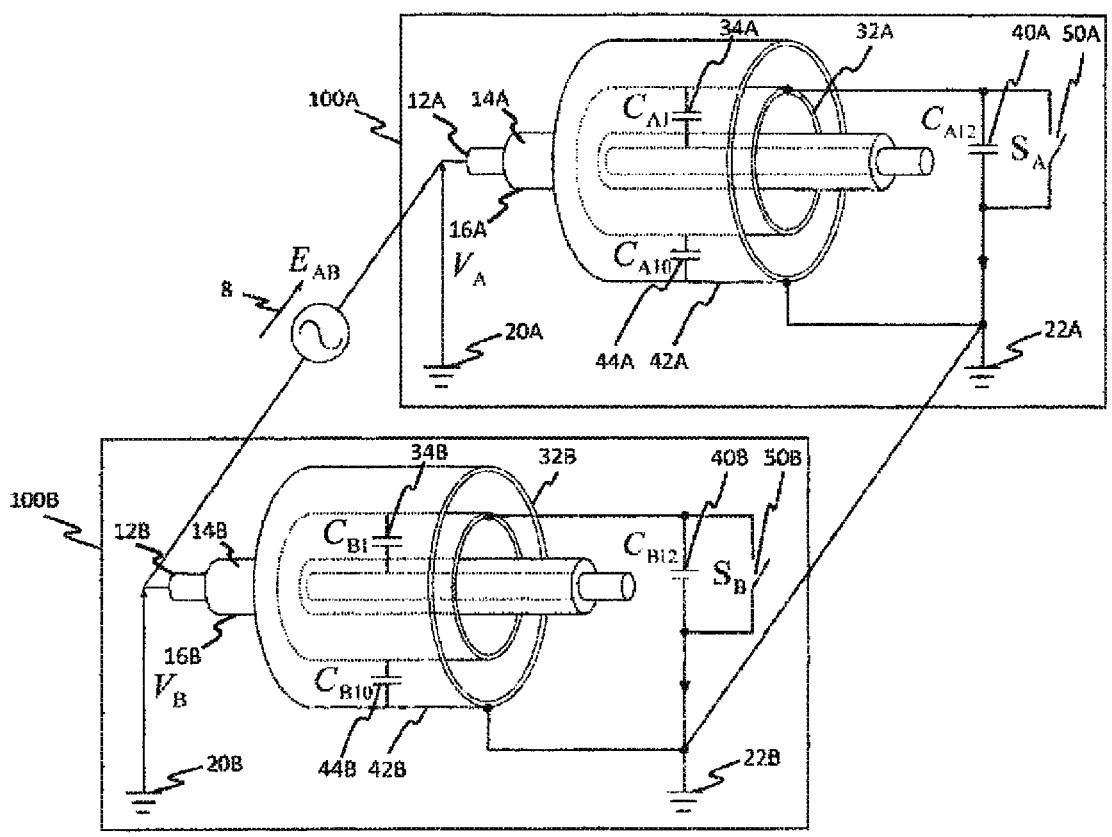
FIG. 6 is a descriptive diagram describing one usage example of the measurement device 100 employing the present invention.

The embodiment depicted in FIG. 6 is an example in which two of the measurement device 100 described above are used to measure the voltage $E_{AB}$ between the two electric wires 16A and 16B. In a three-phase three-wire transmission system, voltages between an earthed neutral point and each of the three wires may be measured by the structures described above using FIG. 1 to FIG. 5. Further, wire-to-wire voltages of a three-phase three-wire transmission system may be measured by providing the measurement device 100 at each of the three wires in a similar scheme to that described in FIG. 6.

10. In Conclusion

As described above, according to the measurement devices of the above-described embodiments in which the present invention is employed, the voltage value E of the voltage to be measured 8 that is applied to the conductor 12 of the electric wire 16 relative to the reference potential point 20 may be obtained with high accuracy through simple computation processing without direct contact with the conductor 12 in the state in which the conductor 12 is covered by the insulating coating, regardless of differences in thickness of the conductor 12 of the electric wire 16, the material of the insulating coating 14 and so forth. The reference potential point 20 and the reference potential point 22 are, for example, earthed points.

Information on voltages measured by the measurement device 100 described in accordance with FIG. 1 to FIG. 6 may be used in control systems and monitoring systems for various applications. The computational processing means 70 of the measurement device 100 is described as operating to compute the voltage value E of the voltage to be measured 8. An important feature of the present invention is that measurements may be made both without contact with the conductor 12 of the electric wire 16 and at high accuracy. The processing that computes the voltage value E of the voltage to be measured 8 from the currents $I_1$ and $I_2$ measured by the electric current measurement means 60 may achieve the object of the present invention of obtaining the voltage value E with high accuracy even when conducted by, for example, control systems and monitoring systems for various applications. As described above, what is important is that the current $I_1$ flowing through the parallel circuit 38 in the state in which the opening/closing means 50 of the parallel circuit 38 is closed is measured and that the current $I_2$ flowing through the parallel circuit 38 in the state in which the opening/closing means 50 of the parallel circuit 38 is open is measured. Even if the processing to compute the voltage value E of the voltage to be measured 8 from the currents $I_1$ and $I_2$ measured as described above is performed by, for example, another device, solving the problem to be solved by the present invention at the time of measuring the currents $I_1$ and $I_2$ is assured, and achieving the effects of the present invention is assured.

EXPLANATION OF REFERENCE NUMERALS

8 Voltage to be measured
10 Power supply
12 Conductor
14 Insulating coating
16 Electric wire
20 Reference potential point
22 Reference potential point
32 Electrode
34 Coupling capacitance
36 Electrode
38 Parallel circuit
40 Capacitor
41 Coupling capacitance
42 Shield electrode
44 Coupling capacitance
50 Opening/closing means
52 Opening/closing control means
60 Electric current measurement means
62 Voltage detection means
70 Computational processing means
72 Communications circuit
80 Monitor device
82 Display means
100 Measurement device

The invention claimed is:

1. A non-contact AC voltage measurement device that measures an AC voltage applied to a conductor of an electric wire, the non-contact AC voltage measurement device comprising:

a first electrode provided outside the electric wire, a coupling capacitance being formed between the conductor and the first electrode; and a parallel circuit including a capacitor and an opening/closing means connected in parallel with the capacitor, the parallel circuit being connected in series with the coupling capacitance, wherein, for the purpose of measuring the AC voltage applied to the conductor of the electric wire, a first current and a second current are measured, the first current flowing through the parallel circuit in a state in which the opening/closing means of the parallel circuit is closed, and the second current flowing through the parallel circuit in a state in which the opening/closing means of the parallel circuit is open, wherein, the non-contact AC voltage measurement device further comprising a detection means that detects a state in which the AC voltage applied to the conductor of the electric wire is at a zero-crossing point or close to a zero-crossing state, wherein opening and closing operations of the opening/closing means are controlled on the basis of outputs from the detection means.

2. The non-contact AC voltage measurement device according to claim 1, further comprising: an electric current measurement means that measures the first current and the second current; and a computational processing means that computes the AC voltage applied to the conductor of the electric wire on the basis of the measured first current and second current.

3. The non-contact AC voltage measurement device according to claim 1, further comprising a shield electrode that covers the first electrode.

4. The non-contact AC voltage measurement device according to claim 1, further comprising a monitor device that monitors states of the AC voltage at the conductor.

5. The non-contact AC voltage measurement device according to claim 4, wherein the monitor device includes a display means, and a waveform of the AC voltage at the conductor is displayed at the display means.

* * * * *